United States Patent
Wachtler et al.

(10) Patent No.: US 9,896,330 B2
(45) Date of Patent: Feb. 20, 2018

(54) STRUCTURE AND METHOD FOR PACKAGING STRESS-SENSITIVE MICRO-ELECTRO-MECHANICAL SYSTEM STACKED ONTO ELECTRONIC CIRCUIT CHIP

(71) Applicant: Texas Instruments Incorporated, Dallas, TX (US)

(72) Inventors: Kurt Peter Wachtler, Richardson, TX (US); Makoto Yoshino, Beppu Oita-Ken (JP); Ayumu Kuroda, Beppu Oita-Ken (JP); Brian E. Goodlin, Plano, TX (US); Karen Kirmse, Richardson, TX (US); Benjamin Cook, Rockwall, TX (US); Genki Yano, Beppu Oita-Ken (JP); Stuart Jacobsen, Frisco, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/134,574

(22) Filed: Apr. 21, 2016

(65) Prior Publication Data
US 2017/0197823 A1    Jul. 13, 2017

Related U.S. Application Data

(60) Provisional application No. 62/278,224, filed on Jan. 13, 2016.

(51) Int. Cl.
*B81B 7/00* (2006.01)
*B81C 1/00* (2006.01)

(52) U.S. Cl.
CPC ........ *B81C 1/00325* (2013.01); *B81B 7/0048* (2013.01); *B81B 2207/097* (2013.01);
(Continued)

(58) Field of Classification Search
CPC ... B81B 7/0032; B81B 7/0045; B81B 7/0048; B81C 1/00261; B81C 1/00325
See application file for complete search history.

(56) References Cited

U.S. PATENT DOCUMENTS

2007/0029569 A1*  2/2007  Andrews ................. H01L 33/52
                                                                  257/99
2007/0290364 A1* 12/2007  Gupta ..................... B81C 1/0023
                                                                  257/777

(Continued)

*Primary Examiner* — Daniel Whalen
(74) *Attorney, Agent, or Firm* — Jacqueline J. Garner; Charles A. Brill; Frank D. Cimino

(57) ABSTRACT

A packaged micro-electro-mechanical system (MEMS) device (100) comprises a circuitry chip (101) attached to the pad (110) of a substrate with leads (111), and a MEMS (150) vertically attached to the chip surface by a layer (140) of low modulus silicone compound. On the chip surface, the MEMS device is surrounded by a polyimide ring (130) with a surface phobic to silicone compounds. A dome-shaped glob (160) of cured low modulus silicone material covers the MEMS and the MEMS terminal bonding wire spans (180); the glob is restricted to the chip surface area inside the polyimide ring and has a surface non-adhesive to epoxy-based molding compounds. A package (190) of polymeric molding compound encapsulates the vertical assembly of the glob embedding the MEMS, the circuitry chip, and portions of the substrate; the molding compound is non-adhering to the glob surface yet adhering to all other surfaces.

20 Claims, 2 Drawing Sheets

(52) U.S. Cl.
CPC ... *B81B 2207/99* (2013.01); *B81C 2203/0136* (2013.01); *H01L 2224/32145* (2013.01); *H01L 2224/48091* (2013.01); *H01L 2224/48145* (2013.01); *H01L 2224/48247* (2013.01); *H01L 2224/48465* (2013.01); *H01L 2224/73265* (2013.01)

(56) References Cited

U.S. PATENT DOCUMENTS

| | | |
|---|---|---|
| 2011/0156178 A1 | 6/2011 | Zuniga-Ortiz et al. |
| 2013/0099333 A1 | 4/2013 | Zuniga-Ortiz et al. |
| 2013/0228901 A1 | 5/2013 | Dershem et al. |
| 2013/0328141 A1* | 12/2013 | Ararao ............... B81B 7/0032 257/415 |
| 2015/0177171 A1* | 6/2015 | Kim ................... G01N 27/128 73/31.05 |

* cited by examiner

STRUCTURE AND METHOD FOR PACKAGING STRESS-SENSITIVE MICRO-ELECTRO-MECHANICAL SYSTEM STACKED ONTO ELECTRONIC CIRCUIT CHIP

CROSS-REFERENCE TO RELATED APPLICATIONS

This application claims priority to U.S. Provisional Application No. 62/278,224 filed on Jan. 13, 2016. Said application incorporated herein by reference for all purposes.

FIELD

Embodiments of the invention are related in general to the field of semiconductor devices and processes, and more specifically to the structure and fabrication method of a package for a stress-sensitive micro-electro-mechanical system (MEMS) stacked onto an electronic device chip.

DESCRIPTION OF RELATED ART

The wide variety of products collectively called Micro-Electro-Mechanical devices (MEMS) are small, low weight devices on the micrometer to millimeter scale, which may have sensors or mechanically moving parts, and often movable electrical power supplies and controls, or they may have parts sensitive to mechanical, thermal, acoustic, or optical energy. MEMS have been developed to sense mechanical, thermal, chemical, radiant, magnetic, and biological quantities and inputs, and produce signals as outputs. Because of the sensitive parts and moving parts, MEMS have a need for physical and atmospheric protection. Consequently, MEMS are placed on or in a substrate and have to be surrounded by a housing or package, which has to shield the MEMS against ambient and electrical disturbances, and against mechanical and thermal stress.

A Micro-Electro-Mechanical System (MEMS) integrates mechanical elements, sensors, actuators, and electronics on a common substrate. The manufacturing approach of a MEMS aims at using batch fabrication techniques similar to those used for microelectronics devices. MEMS can thus benefit from mass production and minimized material consumption to lower the manufacturing cost, while trying to exploit the well-controlled integrated circuit technology. The mechanically moving parts and the electrically active parts of a MEMS are fabricated together with the process flow of the electronic integrated circuit (IC) on a semiconductor chip.

Following the technology trends of miniaturization, integration and cost reduction, substrates and boards have recently been developed which can embed and interconnect chips and packages in order to reduce board space, thickness, and footprint while increasing power management, electrical performance, and fields of application. Examples include penetration of integrated boards into the automotive market, wireless products, and industrial applications.

As examples, integration boards have been successfully applied to embed wafer level packages, passives, power chips, stacked and bonded chips, wireless modules, power modules, generally active and passive devices for applications requiring miniaturized areas and shrinking thickness.

SUMMARY

A general trend of the electronic industry requires fewer and smaller components in a system. In this trend, a technical and market advantage will be awarded when the number of components in a system is reduced and the product consumes less space and operating power yet offers improved electrical characteristics and higher reliability. For semiconductor devices, a particular advantage can be gained, when a low cost packaging technology can be realized so that it promotes miniaturization by integrating or eliminating parts, and protection by absorbing or shielding disturbances.

As for micro-electro-mechanical systems (MEMS), applicants realized that a particular performance and market advantage can be obtained when a MEMS device can be stacked on an existing electronic circuit device already in production, and in addition the same device package can be used. The problem to be solved in each case is the requirement to perform the processes of stacking and packaging so that the specific parameter-to-be-monitored by the MEMS under consideration remains unaffected and the package is shielding the new device effectively against disturbances of the parameter-to-be-monitored.

For a MEMS of high sensitivity to mechanical and thermal stresses, applicants discovered a solution to the problem of device integration and protection against mechanical and thermal stress disturbances, when they developed a process flow with a unique application of low modulus material and a unique set of process steps to protect the stress-sensitive MEMS device while still utilize standard, low cost package assembly material and assembly methods practiced in production.

The integration of unique materials and process steps into the material set and process flow used to assemble standard molded packages, such as Quad Flat No-Lead (QFN) packages, includes a polyimide ring with phobic surface characteristics deposited on a circuitry chip; low modulus silicone compounds and methods to dispense these compounds under controlled conditions to surround hexahedron-shaped MEMS devices on all sides; and controlled component adhesion to polymeric packaging compounds.

DETAILED DESCRIPTION OF THE PREFERRED EMBODIMENTS

Figure 1:
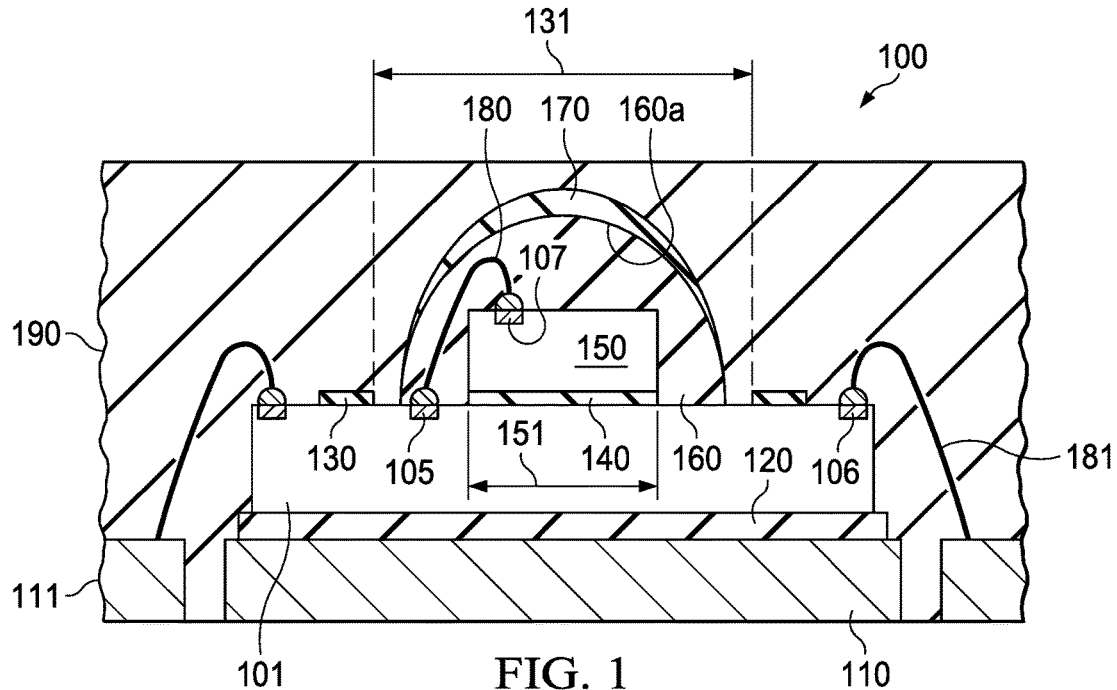
FIG. 1 depicts a cross section of an integrated polymeric-packaged device including a stress-sensitive MEMS device vertically assembly on a circuitry chip attached to a substrate, wherein the MEMS is surrounded by a protective low-modulus material.

FIG. 1 illustrates an exemplary embodiment of the invention, a device generally designated 100. The device includes a semiconductor chip 101 with terminals 106. A portion of the surface of chip 101 is suitable for the attachment of a MEMS device 150. In this exemplary embodiment, the MEMS is stress sensitive. An exemplary chip 101 may be square shaped, have a side length of several millimeters, for instance 2.5 mm, and include a fully functional integrated circuit. In FIG. 1, chip 101 is attached to the pad 110 of a leadframe, preferably using an adhesive epoxy-based polymeric compound 120. The terminals 106 of chip 101 are connected by bonding wires 181 to respective leads 111 of a metallic leadframe; the preferred wire metal is a copper alloy, alternatively gold or aluminum may be used. The vertical assembly of MEMS, chip, and portions of the leadframe chip 101 is embedded in an insulating package 190, preferably made of an epoxy-based molding compound.

In the exemplary device of FIG. 1, the leadframe belongs to the Quad Flat No-Lead (QFN) or in Small Outline No-Lead (SON) families. These leadframes are preferably made from a flat sheet of a base metal, which is selected from a group including copper, copper alloys, aluminum, aluminum alloys, iron-nickel alloys, and Kovar. For many devices, the parallel surfaces of the leadframe base metal are treated to create strong affinity for adhesion to plastic compound, especially molding compounds. As an example, the surfaces of copper leadframes may be oxidized, since copper oxide surfaces are known to exhibit good adhesion to molding compounds. Other methods include plasma treatment (described below) of the surfaces, or deposition of thin layers of other metals on the base metal surface. As an example for copper leadframes, plated layers of tin have been used, or a layer of nickel (about 0.5 to 2.0 µm thick) followed by a layer of palladium (about 0.01 to 0.1 µm thick) optionally followed by an outermost layer of gold (0.003 to 0.009 µm thick).

It should be noted that other embodiments may use other types of leadframes with a chip attachment pad, such as leadframes with elongated leads, with cantilevered leads, or with frames having one or more pads in a plane offset from the plane of the leads. Still other embodiments may use laminated substrates made of insulating material alternating with conductive layers. These substrates may have an area suitable for attaching one or more chips, and conductive connections suitable for stitch bonding wires.

As FIG. 1 illustrates, one surface of chip 101 is attached to leadframe pad 110 by epoxy-based compound 120, the opposite chip surface includes an area of diameter 151 suitable for vertically attaching MEMS device 150 using compound 140. In contrast, however, to the polymeric attach compound 120 with a modulus of >2 GPa, the compound 140 is made of a silicone compound with a comparatively very low modulus of <10 MPa.

As an example, compound 140 may be a silicone compound commercially available from Dow Corning Corporation (Corporate Center, Midland, Mich., USA). The compound may be further characterized by low viscosity and thixotropic behavior so that it exhibits weakened constitution when disturbed and strengthened behavior when left standing. Since the modulus of a material characterizes its strain response to an applied stress (or pressure), compound 140 has very compliant mechanical characteristics. This feature is essential to protect the stress-sensitive MEMS, since low modulus material does not transmit stress but rather distributes and absorbs stress. Consequently, low modulus materials, when applied to a side of a stress-sensitive device such as a MEMS, can protect this device against external stress from the covered side. The stress-protecting characteristics of material 140 need to be preserved through the silicone polymerization cycle occurring during the elevated temperature required for the wire-bonding the MEMS terminals (see below).

In order to protect a stress sensitive hexahedron-shaped MEMS on all sides against external stress in conjunction with semiconductor devices, the surrounding cocoon of stress-absorbing and stress-dispersing material has to have a thickness suitable to perform functions in conjunction with semiconductor products. As an example, the material has to have a thickness permitting the attachment of the MEMS to portions of the semiconductor device. As another example, the material has to have a thickness to allow the incorporation of arching spans of bonding wires.

FIG. 1 shows that the diameter 151 of the silicone attachment layer is positioned within the inner diameter 131 of a ring 130 of polyimide material. The terminals 106 of chip 101, however, remain outside ring 130. Ring 130 is made of a polyimide compound. As described below, the configuration of ring 130 as a circle, a rectangle, or any other closed structure, is patterned from a polyimide layer deposited on a semiconductor (preferably silicon) wafer, which includes a plurality of chips with integrated circuits (ICs). After patterning, the polyimide ring is made non-wettable and repellent to silicone materials by reducing the polyimide surface energy in a process cycle, which includes a first curing cycle followed by an ashing process and then in turn by a second curing cycle. Materials other than polyimide may be used as long as they have silicone-repellent surface characteristics.

After the polyimide ring is made repellent, the IC chips are singulated from the wafer. Each chip may then be attached to the pad of a substrate, for instance to the pad 110 of a metallic leadframe as shown in FIG. 1. The adhesive used for the attachment layer 120 is preferably an epoxy-based polymeric formulation.

In the example of FIG. 1, the stress-sensitive MEMS 150 is stacked vertically on IC chip 101 by low modulus silicone layer 140 so that the attachment is inside diameter 131 of the silicone ring 130; layer 140 protects MEMS 150 against stress from the direction of chip 101. After the MEMS attachment, terminals 107 of MEMS 150 can be connected to contact pads 105 of chip 101 using bonding wires 180. It should be noted that pads 105 are located inside diameter 131 of silicone ring 130. Thereafter, chip terminals 106 are connected to substrate connectors (such as leadframe leads 111) using bonding wires 181.

As FIG. 1 illustrates, MEMS 150 is surrounded by a glob 160, which also covers bonding wires 180 and pads 105 and therefore has a dome-shaped configuration. Glob 160 is made of low modulus silicone material, preferably the same silicone material as layer 140. As an example, the silicone of glob 160 may be a silicone commercially available from Dow Corning Corporation. The silicone material is selected so that is has hydrophobic and non-adhesive characteristics towards the polymeric molding formulation, which has been selected as encapsulation compound. The viscosity, modulus, and thixotropic index of the silicone material is selected so that glob 160 can be dispensed in a precision volume and glob 160 is restricted to the surface area inside the polyimide ring 130 and does not bleed out across the ring.

After the dispensing process, the silicone compound of glob 160 is polymerized in a curing process. Thereafter, glob 160 surrounds the non-attached five sides of the hexahedron-shaped MEMS device and its connecting wire bonds. Glob 160 may have approximately the shape of a hemisphere. Together with the low modulus silicone compound of the attach material, all six sides of the MEMS devices are thus surrounded by low modulus material operable to protect the MEMS against any stress by blunting, dispersing and absorbing external stress arriving at the glob surface.

The device including MEMS 150 stacked on circuit chip 101, which in turn is mounted on substrate 110, needs to be in a rigid and strong package. The embodiment of FIG. 1 depicts an encapsulation material 190 forming the package for a device 100 belonging to the QFN/SON product families. Other embodiments may belong to different product families. Independent of the actual configuration of the package and the leadframe, it is required that package material 190 should not affect the operation of MEMS 150. As a consequence, this requirement means for the stress-sensitive MEMS of FIG. 1 that package material 190 needs to adhere strongly to all parts packaged inside (to prevent delamination) except to blob 160 surrounding MEMS 150. There are two methods to achieve this goal; the different process flows are discussed below.

Figures 2, 3:
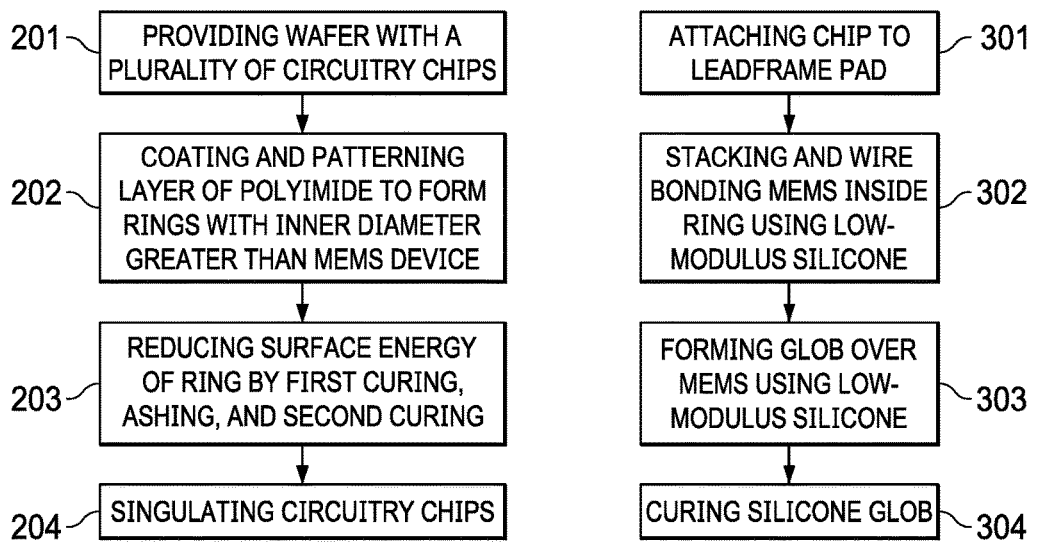
FIG. 2 shows a diagram of the process flow in a semiconductor wafer fabrication according to the invention.
FIG. 3 displays a portion of a process flow in a semiconductor assembly factory according to the invention.

FIG. 1 indicates a surface 160*a* of glob 160 with a layer 170 on the surface. Based on the first process flow (described in FIGS. 3 and 4), surface 160*a* has been activated by plasma etching and thereafter covered by layer 170 comprising cured low modulus silicone compound. The packaging compound 190 will not adhere to layer 170 made of cured (and thus de-activated) silicone compound.

Based on the second process flow (described in FIGS. 3 and 5), surface 160*a* constitutes cured (and thus de-activated) low modulus silicone, which will not adhere to the packaging compound 190, and is covered by layer 170 comprising cured epoxy compound. The packaging compound 190, also an epoxy compound, will adhere to and eventually even merge into layer 170 and face the non-adhesive cured silicone surface 160*a*.

In summary, by either one of these methods, packaging compound 190 (preferably a molding compound) will not adhere to the cured glob 160 and thus cannot transmit external stress into the glob 160 and to the stress-sensitive MEMS 150. Consequently, MEMS 150 can operate undisturbed by external stress.

Another embodiment of the invention is a method to fabricate a common package for a stress-sensitive micro-electro-mechanical system (MEMS) vertically stacked onto a semiconductor circuitry chip. The method is described as a process flow, which includes processes (FIG. 2) performed in a semiconductor wafer factory and processes (either FIGS. 3 and 4, or FIGS. 3 and 5) performed in a semiconductor assembly factory.

The method starts in a wafer factory by providing a silicon wafer, which contains a plurality of integrated circuit (IC) chips and has completed the front-end processes for fabricating the ICs. The intention is to couple a discrete IC chip with a stress-sensitive MEMS and unite them in a common package executed so that the IC and the MEMS can operate undisturbed. The process flow begins with the processes listed in FIG. 2.

In the first step 201 of the process flow, a semiconductor wafer is provided, which includes a plurality of chips with integrated circuits (ICs). In process 202, a layer of polyimide material is coated over the surface of the plurality of chips. Then, the polyimide layer is patterned to form a polyimide ring on each chip, wherein the rings have an inner diameter greater than the largest linear dimension of the MEMS device-to-be-assembled. For the patterning process, a photolithographic method is used which employs sequentially the process of spinning-on a photoresist layer, masking the photoresist, exposing the mask-protected layer to irradiation, and developing the layer.

After the patterning, the surface energy of the polyimide rings is reduced in process 203 by subjecting the polyimide material consecutively to the processes of curing the polyimide compound for a first time, then ashing the polyimide compound, and finally curing the polyimide compound for a second time. The ashing process involves an oxygen plasma and elevated temperatures; alternatively, a hydrogen plasma could be used. The reduced surface energy renders the polyimide rings hydrophobic and repellent to low viscosity and low modulus silicone compounds; silicone material deposited inside the polyimide ring will not bleed out across the polyimide rings. The IC chips are singulated from the wafer in process 204.

In process 301, the discrete chips can be attached to respective assembly pads of a substrate in an assembly factory. The assembly pad may be the chip pad of a leadframe, or alternatively the assembly pad of a laminated substrate. Preferably, the chip is attached to the pad using an epoxy-based compound, which may be cured in a later process at elevated temperature (for instance during wire bonding).

In order to attach a MEMS device to the circuitry chip and use only a single and preferably small package for the IC chip and MEMS combination, the MEMS needs to be vertically attached to the IC chip. In the process 302 of assembling a MEMS device vertically on an IC chip, the MEMS is attached to the chip surface inside the respective polyimide ring using a layer of low modulus silicone material. Such materials are commercially available, for instance from Dow Corning Corporation (Midland, Mich.). For the low modulus material, an attachment layer thickness between about 20 μm and 30 μm may be satisfactory for protection against external stress. It is preferred to polymerize the silicone of the attachment layer before advancing to the wire bonding process.

For the process of wire bonding the terminals of the MEMS device to respective contact pads on the chip surface inside the ring, wires including gold or copper may be used. During the bonding operation, the wires are typically spanned with an arch from the MEMS terminals to the chip contact pads.

In conjunction with the wire bonding process for the MEMS, the process of wire bonding the terminals 106 of the circuitry chip to respective contact pads of the substrate may be performed. Preferably, the bonding wires are made of copper. In FIG. 1, the chip bonding wires are designated 181.

In process 303, a glob is formed by dispensing low-modulus silicone material over the MEMS device and the MEMS bonding wires, while restricting the glob to the surface area inside the polyimide ring. Due to the arches of the bonding wires, the glob has a dome-shaped configuration. The silicone material of the glob is hydrophobic and non-adhesive to thermoset molding compounds. Due to its low viscosity and thixotropic index, it can be dispensed in precision volume. In process 304, the silicone glob is cured.

Since the MEMS of the exemplary embodiment of FIG. 1 is stress sensitive and has to be protected against transmission of stress, and since the MEMS shares the same overall package with the circuitry chip, it is required that the packaging compound encapsulating the assembly should not adhere to the surface of the glob covering the MEMS, but needs to adhere reliably to all other surfaces inside the package. This dichotomy of requirements can be achieved by two methodologies.

Figure 4:
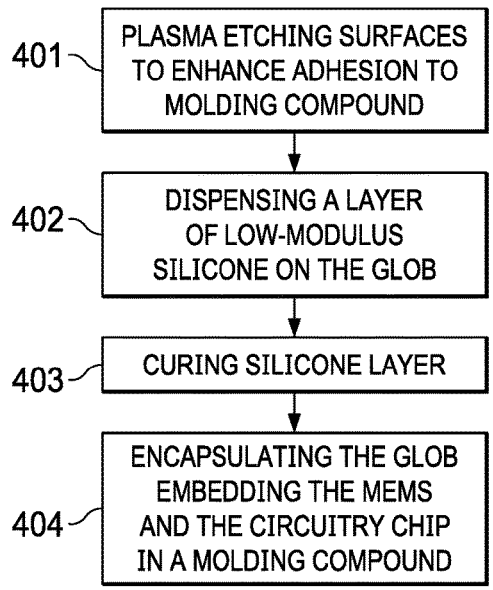
FIG. 4 depicts another portion of a process flow in a semiconductor assembly factory according to the invention.

The first methodology is summarized in FIG. 4. In order to achieve good adhesion to molding compounds, process 401 subjects all surfaces to a plasma etch. The plasma, involving its gas mixture and power for a prescribed time, preferably operates on cooled surfaces. The plasma accomplishes thorough cleaning of the surfaces from adsorbed films, especially water monolayers, thereby freeing up electrical bonds. In addition, the plasma induces some roughening of the surfaces. These effects enhance the adhesion to polymeric filler-filled molding compounds.

Since the cured silicone of the glob has been affected by the plasma of process 401, the glob needs an additional process so that it effectively returns to its original low modulus characteristic. To that end, a layer of the low-modulus silicone material is dispensed onto the surface of the glob in process 402. The nozzle of a syringe releases a controlled drop of the silicone material, which hits the glob and spreads out into a layer of not quite uniform thickness. While a major amount of the drop may remain on the impact location of the glob, some material is bleeding out, resulting in a somewhat non-uniform layer as exemplified by layer 170 in FIG. 1. For the dimensions of the example in FIG. 1, a drop may have a diameter of approximately 30 µm and create a layer of non-uniform thickness with a height of about 13 µm height at the maximum.

In process 403, the silicone layer is cured. Then, in process 404, the assembly comprising the stress-sensitive MEMS embedded in the stress-blocking glob and vertically attached to the semiconductor circuitry chip is encapsulated in a polymeric molding compound, together with the portion of the substrate, onto which the chip is attached and wire bonded. The integrated device is thus packaged.

Figure 5:
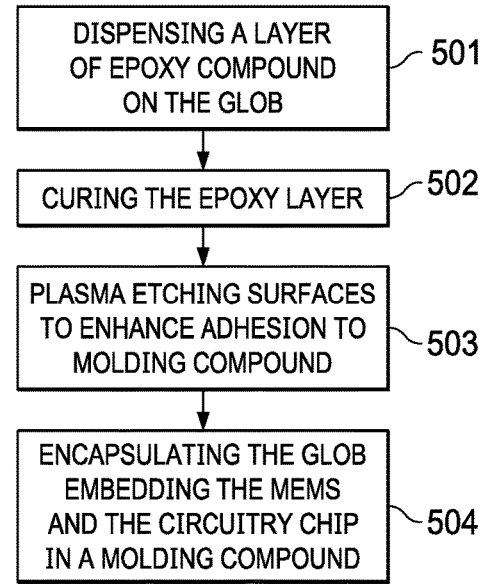
FIG. 5 shows yet another portion of a process flow in a semiconductor assembly factory according to the invention.

The second methodology is summarized in FIG. 5. After the processes of forming a dome-shaped glob by dispensing a low-modulus silicone material over the MEMS and the wire spans, and curing the silicone glob, described above in processes 303 and 304, a layer of epoxy compound is dispensed onto the surface of the glob in process 501. The epoxy may be the same as the molding compound, or it may be a formulation such as CRP-4160G, commercially available from the Sumitomo Corporation, Japan. The layer may be uniform, or it may look similar to layer 170 in FIG. 1; the layer is of a nature so that it may merge with, or may be absorbed into the polymeric encapsulation compound.

In process 502, the epoxy layer is cured. Then, in process 503, all surfaces are subjected to a plasma etch in order to achieve reliable adhesion to molding compounds. The plasma, involving its gas mixture and power for a prescribed time, preferably operates on cooled surfaces. The plasma accomplishes thorough cleaning of the surfaces from adsorbed films, especially water monolayers, thereby freeing up electrical bonds. In addition, the plasma induces some roughening of the surfaces. These effects enhance the adhesion to polymeric filler-filled molding compounds.

In process 504, the assembly comprising the stress-sensitive MEMS embedded in the stress-blocking glob and vertically attached to the semiconductor circuitry chip is encapsulated in a polymeric molding compound, together with the portion of the substrate, onto which the chip is attached and wire bonded. The integrated device is thus packaged.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies to products using any type of semiconductor chip, discrete or integrated circuit, and the material of the semiconductor chip may comprise silicon, silicon germanium, gallium arsenide, gallium nitride, or any other semiconductor or compound material used in integrated circuit manufacturing.

As another example, the invention applies to MEMS having parts moving mechanically under the influence of an energy flow (acoustic, thermal, or optical), a pressure, temperature or voltage difference, or an external force or torque. Certain MEMS with a membrane, plate or beam can be used as a pressure sensor (for instance microphone and speaker), inertial sensor (for instance accelerometer), or capacitive sensor (for instance strain gauge and RF switch); other MEMS operate as movement sensors for displacement or tilt; bimetal membranes work as temperature sensors.

It is therefore intended that the appended claims encompass any such modifications or embodiment.

We claim:

1. A method for packaging an integrated micro-electromechanical system (MEMS) device comprising:
    attaching a semiconductor chip on an assembly pad of a substrate, the substrate including leads, the chip including first and second terminals, a surface of the chip including a closed structure of polyimide;
    attaching the MEMS device on an area of the surface inside the closed structure using a first layer of silicone material;
    spanning bonding wires from terminals of the MEMS device to the first terminals;
    forming a glob by dispensing a second layer of silicone material over the MEMS device and the bonding wires, restricting a surface of the glob to a portion of the surface inside the closed structure;
    curing the glob; and
    dispensing a third layer of silicone material onto a surface of the glob.

2. The method of claim 1 wherein the first, second, and third layers of silicone material are low modulus silicone material with a modulus of <less than 10 MPa (Mega Pascal).

3. The method of claim 1 wherein the second layer is hydrophobic and non-adhesive to epoxy-based molding compounds.

4. The method of claim 1 further including,
    before the process of forming the glob, wire bonding the second terminals to the leads of the substrate;
    after dispensing the third layer of silicone material, curing the third layer; and then covering portions of the integrated device including the MEMS device embedded by the glob, the chip, and the substrate in a polymeric molding compound; and
    after curing the glob and before dispensing the third layer, plasma etching portions of the chip, the substrate and the glob.

5. The method of claim 1 wherein the substrate is a leadframe having the assembly pad and leads.

6. The method of claim 5 wherein the leadframe is a Quad Flat No-Lead (QFN) leadframe.

7. The method of claim 4 wherein the polymeric molding compound is an epoxy-based thermoset molding formulation including inorganic filler particles.

8. The method of claim 1 wherein the process of attaching the chip uses an epoxy-based polymeric compound.

9. The method of claim 1 further including, prior to the process of attaching the chip, processes of:
    coating a layer of polyimide material over the surface of the plurality of chips of a silicon wafer;
    patterning the polyimide layer to form the closed structure on each of the plurality of chips, the patterning process using a photolithographic method including processes of spinning-on a photoresist layer, masking, exposing, and developing the layer; and subjecting the polyimide material consecutively to processes of curing at a first time, ashing, and curing at a second time.

10. The method of claim 9 wherein the ashing process includes an oxygen plasma.

11. A method for packaging an integrated micro-electro-mechanical system (MEMS) device comprising:
attaching a semiconductor chip on an assembly pad of a substrate, the substrate including leads, the chip including first and second terminals, a surface of the chip including a closed structure of polyimide;
attaching the MEMS device on an area of the chip inside the closed structure using a first layer of silicone material;
spanning bonding wires from terminals of the MEMS device to the first terminals;
forming a glob by dispending a second layer of silicone material over the MEMS device and the bonding wires, restricting the glob to a chip surface area inside the closed structure;
curing the glob;
dispensing a layer of epoxy compound onto a surface of the glob;
curing the layer of epoxy; and
covering the MEMS device embedded by the glob, the chip, and portions of the substrate in a polymeric molding compound.

12. The method of claim 11 wherein the first and second layers of silicone are low modulus silicone material with a modulus of <less than 10 MPa (Mega Pascal).

13. The method of claim 11 further including:
before the process of forming the glob, wire bonding second terminals of the chip to contact pads of the substrate; and
after curing the glob and before dispensing the layer of epoxy compound, plasma etching portions of the chip, the substrate and the glob.

14. The method of claim 11 further including, prior to the process of attaching the chip, the processes of:
coating a layer of polyimide material over the surface a plurality of chips of a silicon wafer;
patterning the polyimide layer to form the closed structure on each of the plurality of chips, the patterning process using a photolithographic method including the processes of spinning-on a photoresist layer, masking, exposing, and developing the layer; and
subjecting the polyimide material consecutively to processes of curing at a first time, ashing, and curing at a second time.

15. A packaged micro-electro-mechanical system (MEMS) device comprising:
a pad of a substrate including leads;
a semiconductor chip including circuitry with first and second terminals, the second terminals wire bonded to the leads;
a MEMS device attached to a surface of the chip by a layer of silicone compound, terminals of the MEMS device bonded by wire spans to the first terminals;
a closed structure of polyimide on the surface of the chip surrounding the MEMS device and the first terminals;
a glob of silicone material covering the MEMS device and the wire spans, the glob restricted to the surface of the chip inside the closed structure; and
molding compound covering portions of the glob, the chip, and the substrate, the molding compound non-adhering to the glob.

16. The device of claim 15 wherein the MEMS device is stress sensitive.

17. The device of claim 15 wherein layer of silicone compound and the silicone material are of low modulus silicone compound with a modulus of <less than 10 MPa (Mega Pascal).

18. The device of claim 15 wherein the molding compound is an epoxy-based thermoset molding compound.

19. The device of claim 15 wherein the surface of the closed structure originates from a process sequence of first curing, ashing, and second curing of the polyimide compound.

20. The device of claim 15 wherein the closed structure has a shape of one of a circle and a rectangle.

* * * * *